(12) United States Patent
Wang et al.

(10) Patent No.: US 12,492,319 B2
(45) Date of Patent: Dec. 9, 2025

(54) FINISH COAT COMPOSITION, COMPOSITE MATERIAL, MIDDLE FRAME OF ELECTRONIC DEVICE, HOUSING OF ELECTRONIC DEVICE, AND ELECTRONIC DEVICE

(71) Applicant: Honor Device Co., Ltd., Shenzhen (CN)

(72) Inventors: Xiaoguang Wang, Shenzhen (CN); Guoliang Huo, Shenzhen (CN); Man Gao, Shenzhen (CN); Gang Wang, Shenzhen (CN); Yongqiang Zang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/033,989

(22) PCT Filed: Sep. 6, 2022

(86) PCT No.: PCT/CN2022/117290
§ 371 (c)(1),
(2) Date: Apr. 26, 2023

(87) PCT Pub. No.: WO2023/124198
PCT Pub. Date: Jul. 6, 2023

(65) Prior Publication Data
US 2024/0384126 A1    Nov. 21, 2024

(30) Foreign Application Priority Data

Dec. 31, 2021    (CN) .......................... 202111681939.5

(51) Int. Cl.
*C09D 133/08* (2006.01)
*B05D 5/02* (2006.01)
(Continued)

(52) U.S. Cl.
CPC ............. *C09D 133/08* (2013.01); *B05D 5/02* (2013.01); *B05D 7/58* (2013.01); *C09D 7/20* (2018.01);
(Continued)

(58) Field of Classification Search
None
See application file for complete search history.

(56) References Cited

U.S. PATENT DOCUMENTS

| 2007/0059901 A1* | 3/2007 | Majumdar | ............. H01G 11/48 438/455 |
| 2015/0060870 A1* | 3/2015 | Ro | ...................... H01L 27/1262 156/273.1 |

(Continued)

FOREIGN PATENT DOCUMENTS

| CN | 1778850 A | 5/2006 |
| CN | 102775889 A | 11/2012 |

(Continued)

OTHER PUBLICATIONS

Machine translation of CN 103374245 A (Year: 2013).*
(Continued)

*Primary Examiner* — Shamim Ahmed
*Assistant Examiner* — Bradford M Gates
(74) *Attorney, Agent, or Firm* — Slater Matsil, LLP

(57) ABSTRACT

A finish coat composition, including: 30~60 parts by mass of film-forming resin, where the film-forming resin includes one or more of acrylic resins and polyurethane acrylate resins; 5~20 parts by mass of acrylate monomer; 1~10 parts by mass of photoinitiator; 0.5~10 parts by mass of leveling agent; 0~20 parts by mass of matting powder; and 20~50 parts by mass of solvent. This application further provides a composite material, a middle frame of an electronic device. The finish coat composition according to this application can (Continued)

be crosslinked and cured under an action of ultraviolet light to form a finish coat having good reliability and bonding performance, which is used as a finish coat layer of the middle frame of an electronic device and the battery cover of an electronic device, and has good bonding performance with glue, thereby preventing a screen of the electronic device from falling off.

20 Claims, 6 Drawing Sheets

(51) Int. Cl.
 B05D 7/00 (2006.01)
 C09D 7/20 (2018.01)
 C09D 7/42 (2018.01)
 C09D 7/47 (2018.01)
 G06F 1/16 (2006.01)
(52) U.S. Cl.
 CPC .............. C09D 7/42 (2018.01); C09D 7/47 (2018.01); G06F 1/1635 (2013.01); G06F 1/1637 (2013.01); B05D 2201/00 (2013.01)

(56) References Cited

U.S. PATENT DOCUMENTS

2018/0002549 A1* 1/2018 Deng ................... C09D 133/08
2018/0066155 A1  3/2018 Hwang et al.
2020/0314515 A1* 10/2020 Jang ..................... H04R 1/028
2021/0009843 A1  1/2021 Kim et al.

FOREIGN PATENT DOCUMENTS

| | | |
|---|---|---|
| CN | 103031052 A | 4/2013 |
| CN | 103131320 A | 6/2013 |
| CN | 103374245 A | 10/2013 |
| CN | 102671844 B | 11/2013 |
| CN | 106957597 A | 7/2017 |
| CN | 107298936 A | 10/2017 |
| CN | 107778940 A | 3/2018 |
| CN | 109762461 A | 5/2019 |
| CN | 109776838 A | 5/2019 |
| CN | 109810555 A | 5/2019 |
| CN | 109880507 A | 6/2019 |
| CN | 112538293 A | 3/2021 |
| CN | 112708343 A | 4/2021 |
| CN | 113400733 A | 9/2021 |
| CN | 113429874 A | 9/2021 |
| CN | 113583283 A | 11/2021 |
| JP | 2005170981 A | 6/2005 |
| WO | 2021213113 A1 | 10/2021 |

OTHER PUBLICATIONS

Wang, B., "UV-curable PCDL-based Polyurethane Acrylate Functional Coatings", Jiangnan University, China Academic Journal Electronic Publishing House, Apr. 1, 2014, 68 pages.

* cited by examiner

FINISH COAT COMPOSITION, COMPOSITE MATERIAL, MIDDLE FRAME OF ELECTRONIC DEVICE, HOUSING OF ELECTRONIC DEVICE, AND ELECTRONIC DEVICE

CROSS-REFERENCE TO RELATED APPLICATIONS

This application is a national stage of International Application No. PCT/CN2022/117290, filed on Sep. 6, 2022, which claims priority to Chinese Patent Application No. 202111681939.5, filed on Dec. 31, 2021, both of which are incorporated herein by references in their entireties.

TECHNICAL FIELD

This application relates to the field of electronic device technologies, and in particular, to a finish coat composition, a composite material, a middle frame of an electronic device, a housing of an electronic device, and an electronic device.

BACKGROUND

Currently, a screen of an electronic device is bonded to a housing of the electronic device by using glue, for example, the screen is directly bonded to a battery cover by using battery cover glue, or the screen is bonded to a middle frame of the electronic device by using caulking glue. In this solution, good bonding performance between a touch screen and glue is required, and good bonding performance between the middle frame of the electronic device or the battery cover and glue is also required, so as to prevent the touch screen of the integrated device and a glue line from falling off.

As one of materials for preparing the middle frame of the electronic device and the battery cover, plastic can make the electronic device lighter and thinner. Currently, a spraying process is usually used to decorate appearance of the plastic middle frame or battery cover, so that an ink layer including a priming coat, an effect layer, and a finish coat layer is formed on a plastic substrate. As an outermost protective coating, the finish coat layer has a high crosslinking degree and non-recoatability, resulting in poor bonding performance between the finish coat layer of the plastic middle frame or battery cover and glue.

SUMMARY

This application provides a finish coat composition, a composite material, a middle frame of an electronic device, a housing of an electronic device, and an electronic device, so as to resolve the technical problem of poor bonding performance between a plastic middle frame or battery cover and glue in an electronic device.

To achieve the foregoing objective, this application provides the following technical solutions:

A finish coat composition includes:
30~60 parts by mass of film-forming resin, where the film-forming resin includes one or more of acrylic resins and polyurethane acrylate resins;
5~20 parts by mass of acrylate monomer;
1~10 parts by mass of photoinitiator;
0.5~10 parts by mass of leveling agent;
0~20 parts by mass of matting powder; and
20~50 parts by mass of solvent.

In the finish coat composition according to this application, one or more of the acrylic resins and the polyurethane acrylate resins used as a film-forming substance(s) is/are crosslinked and cured with the acrylic monomer under the action of ultraviolet light to form a finish coat having good reliability and bonding performance, which can be used as a finish coat layer of a middle frame of an electronic device and a battery cover of an electronic device, and can have good bonding performance with glue without etching off the finish coat layer, thereby preventing a screen of the electronic device from falling off. Experimental results show that a shear strength between the finish coat according to this application and a PUR adhesive can reach 20 MPa or more.

In a typical embodiment of this application, the finish coat composition includes:
40~55 parts by mass of film-forming resin, where the film-forming resin is one or more selected from acrylic resins and polyurethane acrylate resins;
8~18 parts by mass of acrylate monomer;
1.5~8 parts by mass of photoinitiator;
0.8~8 parts by mass of leveling agent;
0~20 parts by mass of matting powder; and
25~40 parts by mass of solvent.

The film-forming resin is polyurethane acrylate EB600; the acrylate monomer is tripropylene glycol diacrylate and dodecyl acrylate at a mass ratio of 1:2; the photoinitiator is TPO and 184 at a mass ratio of 1:1; the leveling agent is BYK373 and TEGO900 at a mass ratio of 5:1; the solvent is acetone and n-butanol at a volume ratio of 1:1; and the matting powder is fumed silica or precipitated silica.

The finish coat composition in the foregoing embodiment has an excellent shear strength, can directly replace a finish coat used at a current ink layer, and can bond step glue to a middle frame or a battery cover without changing a process for producing the middle frame or the battery cover or etching off the ink layer, thereby preventing a touch screen of the integrated device and a glue line from falling off, and improving reliability of an electronic device.

According to another aspect, an embodiment of this application further provides a composite material, including:
a plastic substrate layer; and
a finish coat layer composited at the plastic substrate layer, where the finish coat layer is obtained by crosslinking and curing the finish coat composition in the foregoing technical solution.

The foregoing composite material may be made into a middle frame of an electronic device or a battery cover of an electronic device. As an outermost layer of the middle frame or the battery cover, the finish coat layer can be bonded to a screen by using glue without etching, thereby preventing a touch screen of the integrated device and a glue line from falling off, and prolonging the service life of electronic device. In addition, as the outermost layer of the middle frame or the battery cover, the finish coat layer has good reliability.

It should be understood that the description of technical features, technical solutions, beneficial effects, or similar expressions in this application does not imply that all features and advantages can be achieved in any single embodiment. On the contrary, it can be understood that descriptions of the features or beneficial effects means that specific technical features, technical solutions or beneficial effects are included in at least one embodiment. Therefore, the description of technical features, technical solutions, or beneficial effects in this specification does not necessarily mean the same embodiment. Further, the technical features, technical solutions, and beneficial effects described in embodiments may be combined in any appropriate manner. A person skilled in the art will understand that an embodiment may be implemented without one or more specific technical features, technical solutions, or beneficial effects of a specific embodiment. In other embodiments, additional technical features and beneficial effects may also be identified in specific embodiments that do not reflect all embodiments.

BRIEF DESCRIPTION OF THE DRAWINGS

To describe technical methods in embodiments of this application more clearly, the following briefly describes accompanying drawings required for describing embodiments.

FIG. 4 are schematic diagrams of structures of a mobile phone and a cross section thereof according to Embodiment 1 of this application, where FIG. 4b is a schematic diagram of a structure of a cross section A-A of the mobile phone shown in FIG. 4a;

FIG. 6 are schematic diagrams of structures of a mobile phone and a cross section thereof according to Embodiment 2 of this application, where FIG. 6b is a schematic diagram of a structure of a cross section B-B of the mobile phone shown in FIG. 6a;

FIG. 7 are schematic diagrams of structures of a mobile phone and a cross section thereof according to Embodiment 3 of this application, where FIG. 7b is a schematic diagram of a structure of a cross section C-C of the mobile phone shown in FIG. 7a.

DETAILED DESCRIPTION OF ILLUSTRATIVE EMBODIMENTS

Figure 1:
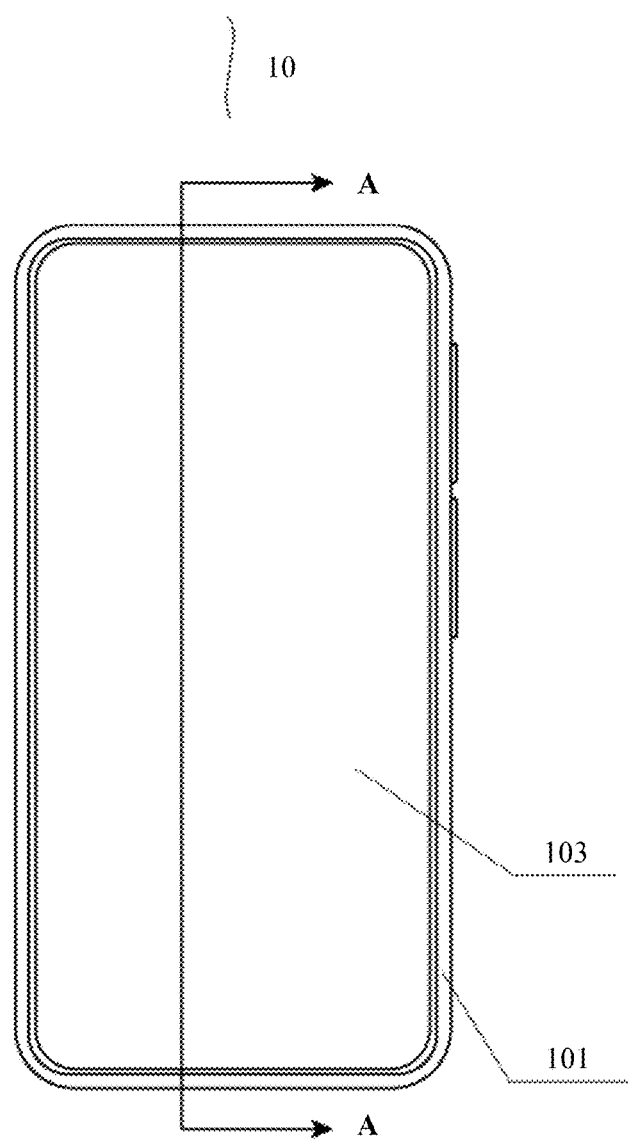
FIG. 1 is a schematic diagram of a typical structure of a mobile phone.

The following clearly describes technical solutions in embodiments of this application with reference to accompanying drawings in embodiments of this application. Terms used in the following embodiments are merely intended for the purpose of describing specific embodiments, but not intended to limit this application. As used in the specification and the appended claims of this application, the terms "one", "a/an", "said", "the", and "this" of singular forms are also intended to include, for example, the form of "one or more", unless otherwise specified in the context clearly. It should be further understood that in embodiments of this application, "one or more" means one, two, or more than two; and the term "and/or" in this specification is only an associative relationship for describing associated objects, indicating that three relationships may exist. For example, A and/or B may represent the following three cases: Only A exists, both A and B exist, and only B exists, where A and B may be singular or plural. The character "/" generally indicates an "or" relationship between associated objects.

Referring to "one embodiment" or "some embodiments" or the like described in this specification means that one or more embodiments of this application include a specific feature, structure, or characteristic described with reference to the embodiment. Therefore, the statements "in one embodiment", "in some embodiments", "in some other embodiments", and the like appearing at different locations in this specification do not mean that these embodiments are all necessarily referred to, but mean "one or more but not all embodiments", unless otherwise specifically emphasized in other ways. The terms "include", "comprise", "have", and their variants all mean "including but not limited to", unless otherwise specifically emphasized in other ways.

"A plurality of" described in embodiments of this application means two or more. It should be noted that in the description of embodiments of this application, words such as "first" and "second" are merely used for distinguishing in the description, cannot be understood as indicating or implying relative importance, and cannot be understood as indicating or implying a sequence.

The orientation words such as "up", "down", "inner", and "outer" described in embodiments of this application are relative. It can be understood by a person skilled in the art that when the direction is changed, the orientation changes accordingly.

Reliability described in embodiments of this application includes tests of adhesion, RCA paper tape wear resistance, alcohol friction, rubber friction, vibration friction, pencil hardness, stain resistance, Newton hardness tester, micro Vickers hardness, cosmetic resistance, hand sweat resistance, low-temperature storage, high-temperature storage, alternating damp heat, temperature shock, solar radiation, salt spray, boiling, and the like.

Bonding performance described in embodiments of this application refers to bonding performance between bonding surfaces, which is indicated by a shear strength in this application.

Figure 2:
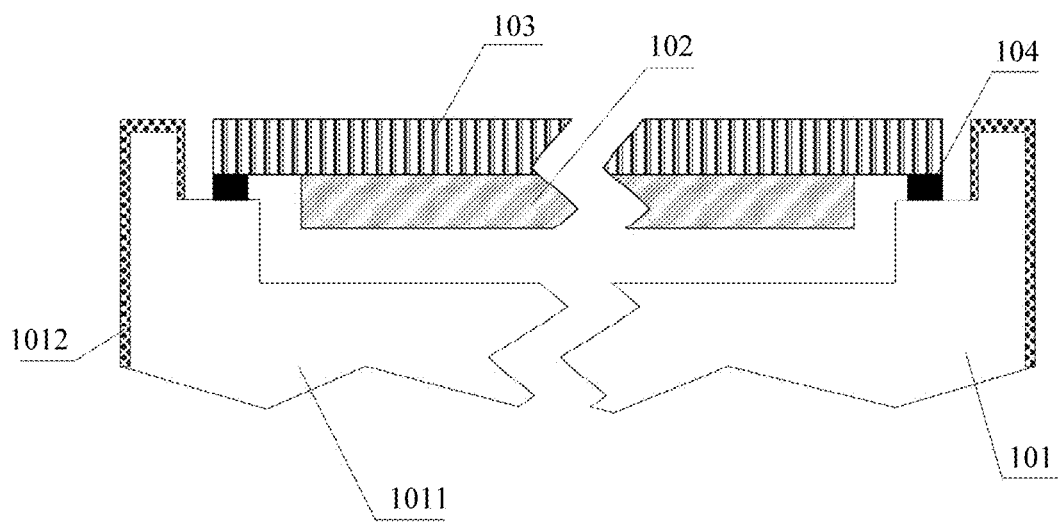
FIG. 2 is a schematic diagram of a structure of a surface A-A of the mobile phone shown in FIG. 1.

This application is described by using a mobile phone as an example. FIG. 1 is a schematic diagram of a typical structure of a mobile phone, and FIG. 2 is a schematic diagram of a structure of a surface A-A of the mobile phone shown in FIG. 1, where 101 indicates a middle frame, 102 indicates a display module, 103 indicates a touch/display module, and 104 indicates step glue.

The mobile phone 10 includes the middle frame 101, where the middle frame 101 has a bottom surface and a side surface, so that the inside of the middle frame 101 forms an accommodating space for accommodating the display module 102 and the touch/display module 103, and the touch/display module 103 is arranged above the display module 102. The top of the middle frame 101 is provided with a groove, so that an inner side surface of the middle frame 101 forms a two-stage step structure; and the touch/display module 103 is bonded to the first-stage step of the middle frame 101 by using the step glue 104, so that the touch/display module 103 and the middle frame 101 form a sealed space.

A laminated structure of the middle frame 401 includes a plastic substrate layer 1011 and an ink layer 1012. The ink layer 1012 usually has a laminated structure, and includes a base coat layer, an effect layer, and a finish coat layer that are in contact with the plastic substrate layer 1011 and that are sequentially laminated. As an outermost layer of the middle frame 401, the finish coat layer features a high crosslinking degree, non-recoatability, and the like. To increase an adhesive force between the step glue 104 and the plastic substrate layer 1011, the ink layer at a contact part between the step glue 104 and the plastic substrate layer 1011 is usually etched off, but the plastic substrate layer has low surface affinity, which leads to poor bonding performance with the step glue.

Based on this, an embodiment of this application provides a finish coat composition. In addition to meeting performance such as wear resistance and stain resistance required by an outermost layer of a middle frame, the finish coat composition further has a certain adhesive force, so that good bonding performance between the step glue 104 and the ink layer 1012 can be achieved without etching off the ink layer of the step glue 104, thereby preventing the screen of the electronic device from falling off.

The finish coat composition according to this application includes:
- 30~60 parts by mass of film-forming resin, where the film-forming resin is one or more selected from acrylic resins and polyurethane acrylate resins;
- 5~20 parts by mass of acrylate monomer;
- 1~10 parts by mass of photoinitiator;
- 0.5~10 parts by mass of leveling agent;
- 0~20 parts by mass of matting powder; and
- 20~50 parts by mass of solvent.

The finish coat composition according to this application includes the film-forming resin, where the film-forming resin is one or more selected from acrylic resins and the polyurethane acrylate. After the acrylic resin and the polyurethane acrylate as main film-forming substances in the finish coat composition are cured and crosslinked with the acrylic monomer, the obtained finish coat not only has good performance such as wear resistance, stain resistance, and cosmetic resistance, but also has good bonding performance. In an embodiment, the acrylic resin is at least one selected from tetrafunctional modified acrylic resins, and the tetrafunctional modified acrylic resin includes, but is not limited to, EB810, Changxing 6261, and the like. In an embodiment, the polyurethane acrylate is at least one selected from hexafunctional aliphatic polyurethane acrylates, and the hexafunctional aliphatic polyurethane acrylate includes, but is not limited to, models such as ST8106, EB600, EB145, EB524, and CN966J5. In an embodiment, the content of the film-forming resin is 40~55 parts by mass. In an embodiment, the content of the film-forming resin is 45~50 parts by mass.

The finish coat composition according to this application includes an acrylate monomer, and the acrylate monomer is used to be cured and crosslinked with the acrylic resin or polyurethane acrylate to improve performance of the obtained finish coat. In an embodiment, the acrylate monomer is one or more selected from acrylate monomers or modified acrylate monomers, and the acrylate monomer include, but is not limited to, tripropylene glycol diacrylate (TPGDA), 1,6-hexanediol diacrylate (HDDA), trimethylolpropane triacrylate (TMP-TA), hydroxypropyl acrylate, hydroxyethyl acrylate, dodecyl acrylate (LA), and the like. In an embodiment, the acrylic monomer is a mixture of tripropylene glycol diacrylate and dodecyl acrylate. In an embodiment, the tripropylene glycol diacrylate and the dodecyl acrylate are at a mass ratio of (1~2):(1~3). In an embodiment, the tripropylene glycol diacrylate and the dodecyl acrylate are at a mass ratio of 1:2. In an embodiment, the content of the acrylate monomer is 8~18 parts by mass. In an embodiment, the content of the acrylate monomer is 10~15 parts by mass.

The finish coat composition according to this application includes a photoinitiator, and the photoinitiator is used to initiate curing and crosslinking of the film-forming resin and the acrylic monomer under the action of ultraviolet light (UV). The photoinitiator includes, but is not limited to, Darocur 1173, TPO, Irgacure 184, Irgacure 369, and the like. In an embodiment, the photoinitiator is one or more of Darocur 1173, TPO, Irgacure 184, or Irgacure 369. In an embodiment, the photoinitiator is a mixture of TPO and Irgacure 184. In an embodiment, the TPO and the Irgacure 184 are at a mass ratio of (1~2):(1~2). In an embodiment, the TPO and the Irgacure 184 are at a mass ratio of 1:1. In an embodiment, the content of the photoinitiator is 1.5~8 parts by mass. In an embodiment, the content of the photoinitiator is 2~4 parts by mass.

The finish coat composition according to this application includes a leveling agent, and the leveling agent is used to make the obtained finish coat flat, smooth, and uniform. In an embodiment, the leveling agent includes at least a silicone leveling agent. In an embodiment, the leveling agent includes a silicone leveling agent and a polyacrylate leveling agent, where the content of the silicone leveling agent is not less than 2%. In an embodiment, the silicone leveling agent is selected from TEGO900, TEGO920, or BYK373. In an embodiment, the leveling agent is a mixture of BYK373 and TEGO900. In an embodiment, the BYK373 and the TEGO900 are at a mass ratio of (3~8):1. In an embodiment, the BYK373 and the TEGO900 are at a mass ratio of 5:1. In an embodiment, a usage of the leveling agent is 0.8~8 parts by mass. In an embodiment, a usage of the leveling agent is 1~5 parts by mass.

As a solvent-based finish coat composition, the finish coat composition according to this application includes a solvent, and the solvent is used to dissolve each component as a medium and make the components cured and crosslinked under the action of ultraviolet light and the photoinitiator. In an embodiment, the solvent is a mixed solvent, which is any two or more selected from acetone, n-butanol, ethylene glycol-butadiene, and ethyl acetate. In an embodiment, the solvent is acetone and n-butanol. In an embodiment, the solvent is acetone and ethylene glycol-butadiene. In an embodiment, the solvent is acetone and ethyl acetate. In an embodiment, the solvent is n-butanol and ethylene glycol-butadiene. In an embodiment, the solvent is n-butanol and ethyl acetate. In an embodiment, the solvent is ethylene glycol-butadiene and ethyl acetate. In an embodiment, the solvent is acetone, n-butanol, and ethylene glycol-butadiene. In an embodiment, the solvent is acetone, n-butanol, and ethyl acetate. In an embodiment, the solvent is n-butanol, ethylene glycol-butadiene, and ethyl acetate. In an embodiment, the solvent is acetone, n-butanol, ethylene glycol-butadiene, and ethyl acetate. In this application, no special limitation is imposed on the usage of each component in the solvent. In a two-component solvent, a mass ratio of two components is (1~3):(1~3); in a three-component solvent, a mass ratio of three components is (1~3):(1~3):(1~3); and in a four-component solvent, a mass ratio of four components is (1~3):(1~3):(1~3):(1~3). In an embodiment, a usage of the solvent is 25~40 parts by mass.

The finish coat composition according to this application may further include a matting agent, so that the finish coat formed after curing has a matte effect. In an embodiment, the matting agent is a silica matting agent, such as an organic modified chemically-precipitated silica or fumed silica matting agent, and no matting wax slurry can be used. In an embodiment, the matting agent has a particle size 3~12 microns. In an embodiment, a usage of the matting agent is 5~15 parts by mass.

In an embodiment, the finish coat composition according to this application includes:
- 40~55 parts by mass of film-forming resin, where the film-forming resin is one or more selected from acrylic resins and polyurethane acrylate resins;
- 8~18 parts by mass of acrylate monomer;
- 1.5~8 parts by mass of photoinitiator;
- 0.8~8 parts by mass of leveling agent;
- 0~20 parts by mass of matting powder; and
- 25~40 parts by mass of solvent.

In an embodiment, the finish coat composition according to this application includes:
- 45~50 parts by mass of film-forming resin, where the film-forming resin is one or more selected from acrylic resins and polyurethane acrylate resins;
- 10~15 parts by mass of acrylate monomer;
- 2~4 parts by mass of photoinitiator;
- 1~5 parts by mass of leveling agent;
- 5~15 parts by mass of matting powder; and
- 25~40 parts by mass of solvent.

The finish coat composition according to this application can be crosslinked and cured under an action of ultraviolet light to form a finish coat having good reliability and bonding performance, which can be used as a finish coat layer of a middle frame of an electronic device and a battery cover of an electronic device. Experimental results show that a shear strength between the finish coat according to this application and a PUR adhesive can reach 20 MPa or more.

This application further provides a composite material, including:
- a plastic substrate layer; and
- a finish coat layer composited at the plastic substrate layer, where the finish coat layer is obtained by crosslinking and curing the finish coat composition in the foregoing technical solution.

Figure 3:
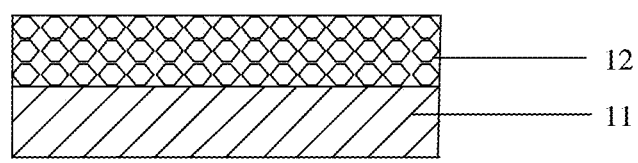
FIG. 3 is a schematic diagram of a structure of a composite material according to an embodiment of this application.

FIG. 3 is a schematic diagram of a structure of a composite material according to an embodiment of this application, where 11 indicates a plastic substrate layer, and 12 indicates a finish coat layer.

In the composite material, as a supporting material, the plastic substrate layer 11 has performance such as high strength and high modulus. In an embodiment, the material of the plastic substrate layer 11 includes, but is not limited to, polycarbonate (PC), nylon (PA), glass fiber-modified nylon (PA+GF), glass fiber-modified polycarbonate (PC+GF), aramid fiber-modified polycarbonate (AF+PC), and the like.

The finish coat layer 12 is composited on the surface of the plastic substrate layer 11, has good wear resistance, chemical resistance, stain resistance, and the like as an outer protective layer, and has good bonding performance as a bonding surface, thereby improving bonding performance of the composite material. The finish coat layer is obtained by crosslinking and curing the foregoing finish coat composition. Details are not described herein again in this application.

In another embodiment, the composite material further includes a base coat layer composited between the plastic substrate layer 11 and the finish coat layer 12, and the base coat layer is used to improve a bonding strength between the plastic substrate layer 11 and the finish coat layer 12. In this application, no special limitation is imposed on the components of the base coat layer and content thereof.

In another embodiment, the composite material further includes an effect layer composited between the base coat layer and the finish coat layer 12, and the effect layer can be formed at the base coat layer by using a method such as coating, electroplating, laser etching, and chemical deposition, so that the composite material has special optical or other appearance effects, such as matte and glare effects. In this application, no special limitation is imposed on the components of the effect layer and content thereof, and a method for preparing the effect layer. For example, an effect layer may be formed through non conductive vacuum metallization (NCVM).

The composite material according to this application may be used to produce a middle frame, battery cover or another housing assembly of an electronic device, which is bonded to a touch screen by using glue. A good bonding capability of the finish coat layer 12 can improve a bonding capability between the touch screen and the finish coat layer, thereby preventing the touch screen or a glue line from falling off.

Based on this, this application further provides a middle frame of an electronic device, and a laminated structure of the middle frame includes:
- a plastic substrate layer; and
- a finish coat layer composited at the plastic substrate layer, where the finish coat layer is formed by curing and crosslinking the finish coat composition in the foregoing technical solution.

This application further provides a battery cover of an electronic device, and a laminated structure of the battery cover includes:
- a plastic substrate layer; and
- a finish coat layer composited at the plastic substrate layer, where the finish coat layer is formed by curing and crosslinking the finish coat composition in the foregoing technical solution.

In this application, the mobile phone is used as an example to describe the middle frame of an electronic device, the battery cover of an electronic device, and the electronic device in detail. However, it can be understood that the electronic device in this application may be any device with communication and storage functions, such as a smartphone, a cellular phone, a cordless phone, a session initiation protocol (Session Initiation Protocol, SIP) phone, a tablet computer, a personal digital assistant (Personal Digital Assistant, PAD), a notebook computer, a digital camera, an e-book reader, a portable multimedia player, a handheld device with a wireless communication function, a computing device or another processing device connected to a wireless modem, an in-vehicle device, a wearable device, and a 5G terminal device, which is not limited in embodiments of this application.

Figure 4A:
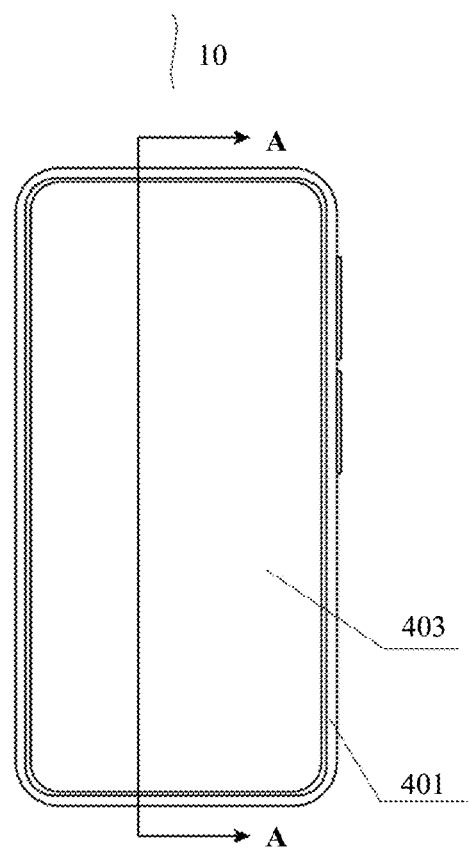
FIG. 4a is a schematic diagram of a structure of a mobile phone according to Embodiment 1 of this application.
Figure 4B:
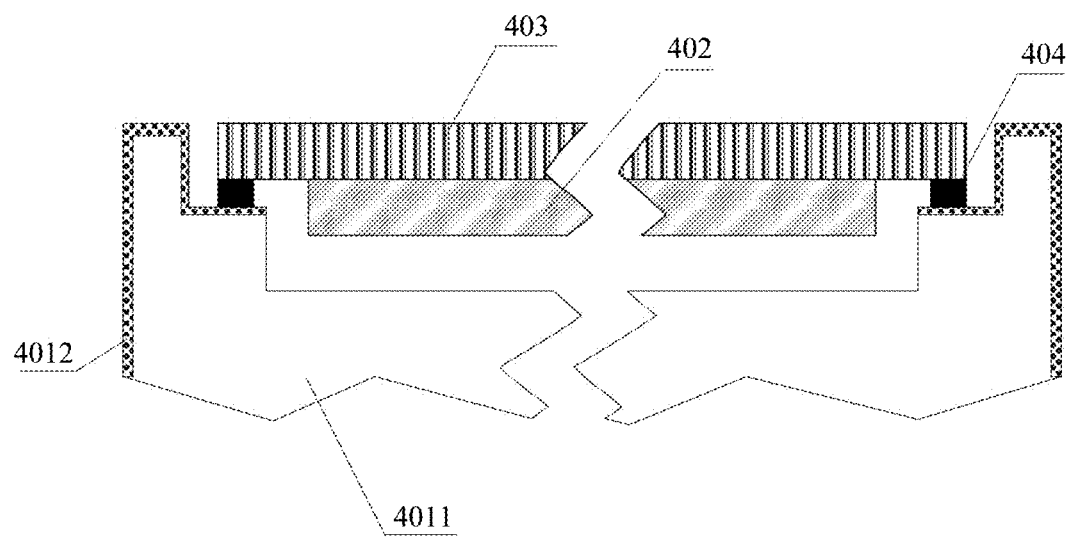

FIG. 4 are schematic diagrams of structures of a mobile phone and a cross section thereof according to Embodiment 1 of this application, where FIG. 4a is a schematic diagram of a structure of a mobile phone according to Embodiment 1 of this application, and FIG. 4b is a schematic diagram of a structure of a cross section A-A of the mobile phone shown in FIG. 4a. 401 indicates a middle frame, 402 indicates a display module, 403 indicates a touch/display module, and 404 indicates step glue.

The mobile phone 10 includes the middle frame 401, where the middle frame 401 has a bottom surface and a side surface, so that the inside of the middle frame 401 forms an accommodating space for accommodating the display module 402 and the touch/display module 403, and the touch/display module 403 is arranged above the display module 402. The middle frame 401 is provided with a groove, so that an inner side surface forms a two-stage step structure, and the touch/display module 403 is bonded to the first-stage step of the middle frame 401 by using the step glue 404, so that the touch/display module 403 and the middle frame 401 form a sealed space.

The middle frame 401 includes a plastic substrate layer 4011 and an ink layer 4012 disposed at the plastic substrate layer 4011. The ink layer 4012 is disposed on an outer surface and an upper surface of the plastic substrate layer 4011, and a bottom surface and a side surface of the groove, or may be disposed on an inner bottom surface and an inner side surface of the middle frame 401.

Figure 5:
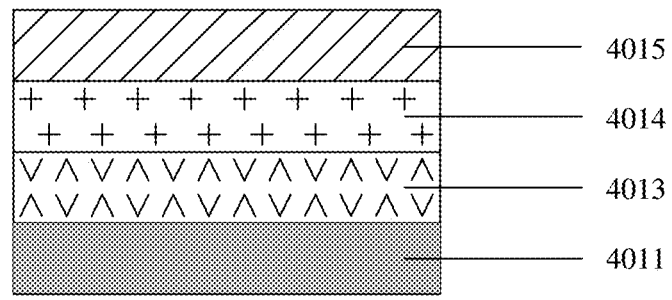
FIG. 5 is a schematic diagram of a laminated structure of a middle frame according to Embodiment 1 of this application.

In this embodiment, a laminated structure of the middle frame 401 is shown in FIG. 5. FIG. 5 is a schematic diagram of a laminated structure of a middle frame according to Embodiment 1 of this application. In FIG. 5, 4011 indicates a plastic substrate layer for forming the middle frame, 4013 indicates a base coat layer formed on the plastic substrate 4011, 4014 indicates an effect layer formed at the base coat layer 4013, and 4015 indicates a finish coat layer formed at the effect layer 4014. The base coat layer 4013, the effect layer 4014, and the finish coat layer 4015 are the ink layer 4012.

The plastic substrate layer 4011 is a main material for forming the middle frame, features high modulus, high strength, and the like, and may be polycarbonate (PC), nylon (PA), glass fiber-modified nylon (PA+GF), glass fiber-modified polycarbonate (PC+GF), aramid fiber-modified polycarbonate (AF+PC), and the like.

The base coat layer 4013 may be formed at the plastic substrate layer 4011 through coating, and can form strong interface bonding with the plastic substrate layer 4011, thereby increasing reliability of a mobile phone. In this application, no special limitation is imposed on the components of the base coat layer 4013 and content thereof.

The effect layer 4014 can be formed at the base coat layer 4013 by using a method such as coating, electroplating, laser etching, and chemical deposition, to achieve an effect required for the middle frame appearance, especially a frame, such as matte and glare. In this application, no special limitation is imposed on the components of the effect layer and content thereof, and a method for preparing the effect layer. For example, an effect layer may be formed through non conductive vacuum metallization (NCVM).

The finish coat layer 4015 is formed at the effect layer 4014 through coating, which can enhance performance such as wear resistance and hardness of the middle frame, and increase bonding performance of the middle frame, so that the middle frame can be closely bonded to step glue without other treatments, thereby reducing a risk of degumming and falling off of a display. The finish coat layer 4015 is formed by curing and crosslinking the finish coat composition in the foregoing technical solution. Details are not described herein again in this application.

In another embodiment, the laminated structure of the middle frame 401 may be provided with no base coat layer, no effect layer, or neither the base coat layer nor the effect layer, which does not affect the finish coat layer of the middle frame 401 having high reliability and bonding capability.

In this embodiment, the middle frame 401 is bonded to the touch/display module 403 by using the step glue 404, and the step glue 404 may be a moisture-curing polyurethane reactive hot melt adhesive (PUR adhesive) as an adhesive. A good bonding capability is achieved between the finish coat composition in the foregoing solution and the PUR adhesive, which can improve bonding performance between a screen and the middle frame.

Figure 6A:
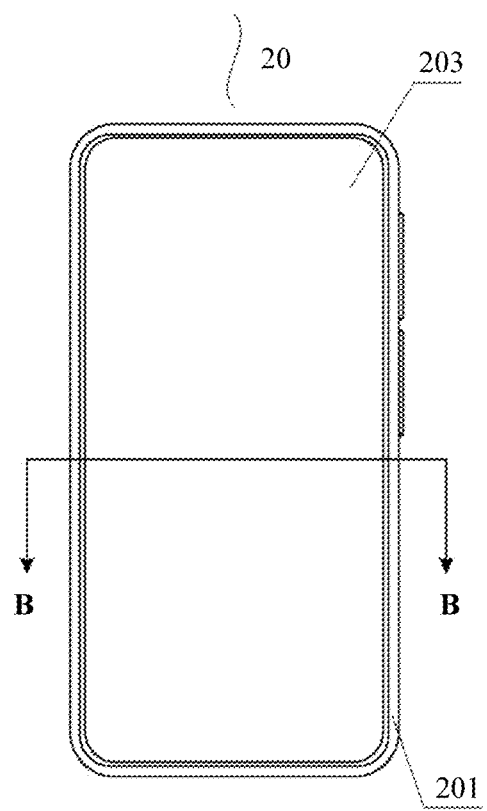
FIG. 6a is a schematic diagram of a structure of a mobile phone according to Embodiment 2 of this application.
Figure 6B:
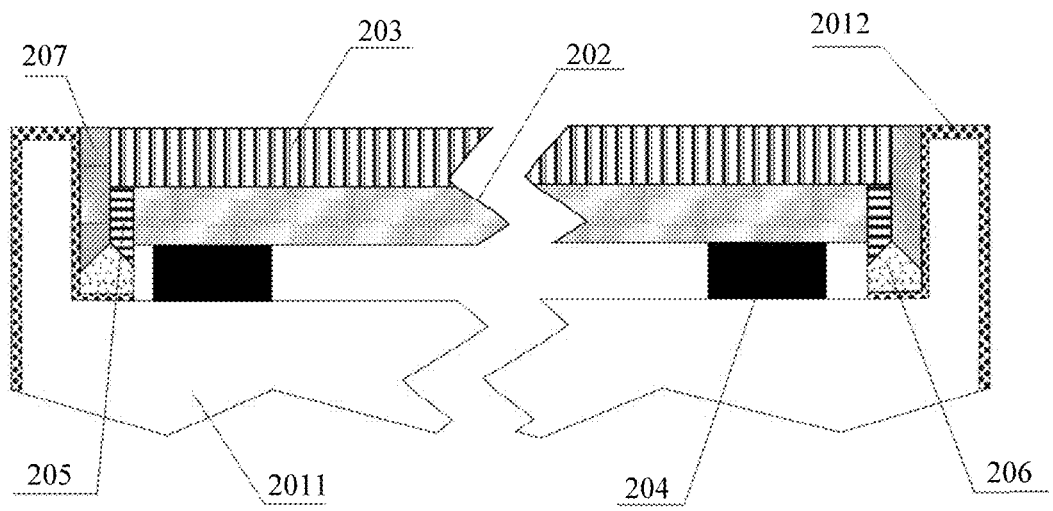

In another embodiment, the middle frame may be bonded to the display module and the touch/display module by using side caulking glue. FIG. 6 are schematic diagrams of structures of a mobile phone and a cross section thereof according to Embodiment 2 of this application, where FIG. 6a is a schematic diagram of a structure of a mobile phone according to Embodiment 2 of this application, and FIG. 6b is a schematic diagram of a structure of a cross section B-B of the mobile phone shown in FIG. 6a. 201 indicates a middle frame, 202 indicates a display module, 203 indicates a touch/display module, 204 indicates a double-sided adhesive, 205 indicates side sealing glue, 206 indicates inner caulking glue, and 207 indicates side caulking glue.

The mobile phone 20 includes the middle frame 201, where the middle frame 201 has a bottom surface and a side surface, so that the inside of the middle frame 201 forms an accommodating space for accommodating the display module 202 and the touch/display module 203, and the touch/display module 203 is arranged above the display module 202. The bottom of the display module 202 is bonded to an inner bottom surface of the middle frame 201 by using the double-sided adhesive 204, and a side surface of the display module 202 and a side surface of the touch/display module 203 form a closed space with an inner side surface of the middle frame 201 by using the side sealing glue 205, the inner caulking glue 206, and the side caulking glue 207.

The middle frame 201 includes a plastic substrate layer and an ink layer 2012 disposed at the plastic substrate layer 2011. The ink layer 2012 is disposed on an outer surface, an upper surface, and the inner side surface of the middle frame, and a part where the inner bottom surface is bonded to the inner caulking glue 206, and may also be disposed at a part where the inner bottom surface of the middle frame is not bonded to the inner caulking glue 206. The laminated structure of the middle frame 201 is the same as that of the middle frame 101 described above. Details are not described herein again in this application.

In Embodiment 2, the double-sided adhesive 204 is used to increase the bonding capability between the middle frame 201 and the display module 202, and may be a pressure-sensitive adhesive with a three-layer structure of acrylic adhesive/foam/acrylic adhesive.

The inner caulking glue 206 is used to fill a gap between the bottom of the display module 202 and the inner side surface of the middle frame 201, the side caulking glue 205 is used to fill the side surface of the display module 202 to achieve the same width as the touch/display module 203, and the side caulking glue 207 is used to fill a gap between the inner side surface of the middle frame 201 and both the touch/display module 203 and the side sealing glue 205, thereby forming a closed space. In this embodiment, the side sealing glue 205, the inner caulking glue 206, and the side caulking glue 207 may be PUR adhesives. A good bonding capability is achieved between the finish coat composition in the foregoing solution and the PUR adhesive, which can improve bonding performance between a screen and the middle frame.

Figure 7A:
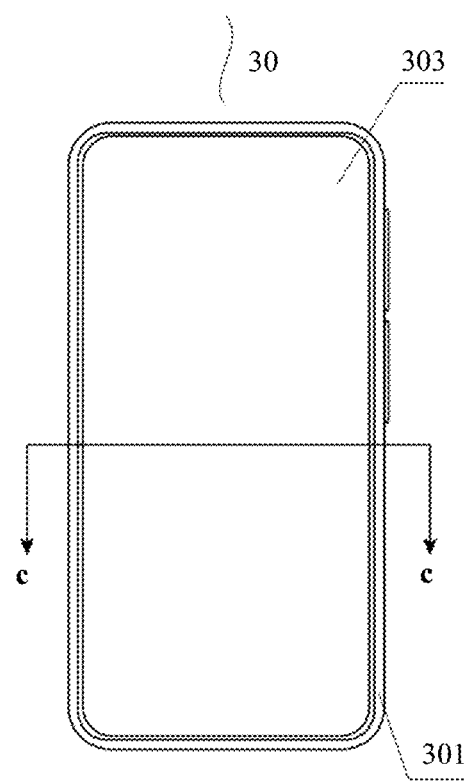
FIG. 7a is a schematic diagram of a structure of a mobile phone according to Embodiment 3 of this application.
Figure 7B:
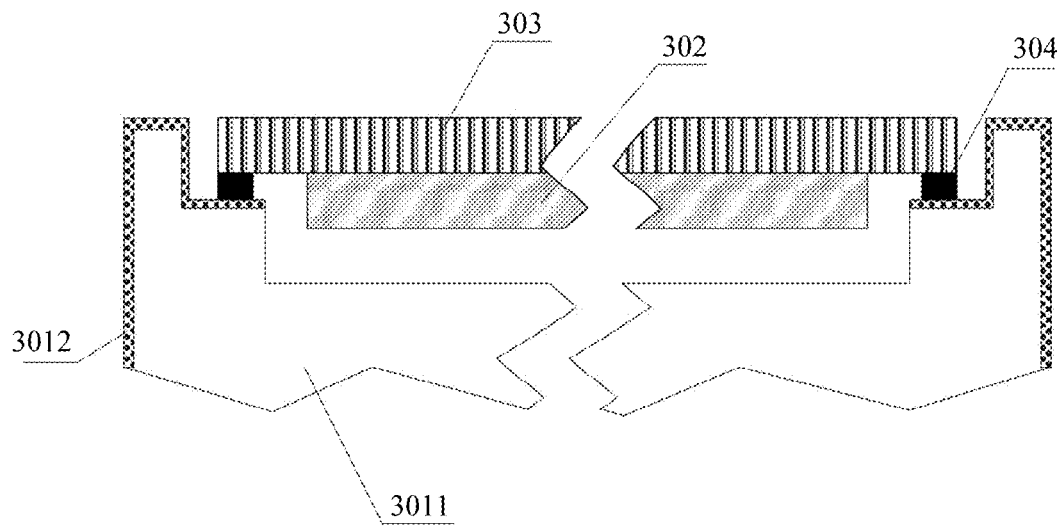

This application further provides a battery cover. FIG. 7 are schematic diagrams of structures of a mobile phone and a cross section thereof according to Embodiment 3 of this application, where FIG. 7a is a schematic diagram of a structure of a mobile phone according to Embodiment 3 of this application, and FIG. 7b is a schematic diagram of a structure of a cross section C-C of the mobile phone shown in FIG. 7a. 301 indicates a middle frame, 302 indicates a display module, 303 indicates a touch/display module, and 304 indicates battery cover glue.

The mobile phone 30 includes the battery cover 301, where the battery cover 301 has a bottom surface and a side surface, so that the inside of the middle frame 301 forms an accommodating space for accommodating the display module 302 and the touch/display module 303, and the touch/display module 303 is arranged above the display module 302. The top of the battery cover 301 is provided with a groove, so that an inner side surface of the middle frame 301 forms a two-stage step structure; and the touch/display module 303 is bonded to the first-stage step of the battery cover 301 by using the battery cover glue 304, so that the touch/display module 303 and the battery cover 301 form a sealed space.

The battery cover 301 includes a plastic substrate layer 3011 and an ink layer 3012 disposed at the plastic substrate layer 3011. The ink layer 3012 is disposed on an outer surface and an upper surface of the plastic substrate layer 3011, and a bottom surface and a side surface of the groove, or may be disposed on an inner bottom surface and an inner side surface of the battery cover 301. The laminated structure of the battery cover 301 is the same as that of the middle frame 101 described above. Details are not described herein again in this application.

The finish coat composition according to this application can directly replace a finish coat used at a current ink layer, and there is no need to change a process for producing the middle frame or the battery cover, and there is no need to etch off the ink layer.

The finish coat composition, the composite material, the middle frame of an electronic device, the battery cover of an electronic device, the housing of an electronic device, and the electronic device according to this application are further described below with reference to embodiments.

In the following embodiments, polyurethane acrylate is EB600; an acrylate monomer is a mixture of tripropylene glycol diacrylate (TPGDA) and dodecyl acrylate (LA) at a ratio of 1:2; a photoinitiator is a mixture of TPO and 184 at a ratio of 1:1; a leveling agent is a mixture of acrylic polyester-modified polysiloxane BYK373 and TEGO900 at a ratio of 5:1; a solvent is acetone and n-butanol at a volume ratio of 1:1; and matting powder is fumed silica or precipitated silica.

Embodiment 1

A finish coat composition includes the following components:
50 parts of polyurethane acrylate;
10 parts of acrylate monomer;
3 parts of photoinitiator;
3.5 parts of leveling agent; and
40 parts of solvent.

A middle frame prepared from glass fiber-modified nylon (PA) sequentially undergoes spraying to form a base coat, and electroplating of an NCVM layer to form an effect layer, then the foregoing finish coat composition is coated, and a finish coat is obtained after ultraviolet curing.

Embodiment 2

A finish coat composition includes the following components:
45 parts of polyurethane acrylate;
15 parts of acrylate monomer;
2.5 parts of photoinitiator;
5 parts of leveling agent; and
10 parts of matting powder; and
30 parts of solvent.

A middle frame prepared from glass fiber-modified nylon (PA) sequentially undergoes spraying to form a base coat, and electroplating of an NCVM layer to form an effect layer, then the foregoing finish coat composition is coated, and a finish coat is obtained after ultraviolet curing.

Embodiment 3

A finish coat composition includes the following components:
45 parts of polyurethane acrylate;
15 parts of acrylate monomer;
3 parts of photoinitiator;
5 parts of leveling agent; and
40 parts of solvent.

A middle frame prepared from glass fiber-modified nylon (PA) sequentially undergoes spraying to form a base coat, and electroplating of an NCVM layer to form an effect layer, then the foregoing finish coat composition is coated, and a finish coat is obtained after ultraviolet curing.

Embodiment 4

Reliability tests were performed on the finish coat compositions according to Embodiments 1~3, with results shown in Table 1. Table 1 shows the reliability test results of the finish coat compositions according to embodiments of this application.

TABLE 1

Reliability test results of the finish coat compositions according to embodiments of this application

| Test item | Embodiment 1 | Embodiment 2 | Embodiment 3 |
| --- | --- | --- | --- |
| Adhesion test | PASS | PASS | PASS |
| Alcohol friction | PASS | PASS | PASS |
| Rubber friction | PASS | PASS | PASS |
| Vibration friction | PASS | PASS | PASS |
| Pencil hardness | PASS | PASS | PASS |
| Cosmetic resistance test | PASS | PASS | PASS |
| Hand sweat resistance test | PASS | PASS | PASS |
| Low-temperature storage | PASS | PASS | PASS |
| High-temperature storage | PASS | PASS | PASS |
| Alternating damp heat | PASS | PASS | PASS |
| Temperature shock | PASS | PASS | PASS |
| Solar radiation | PASS | PASS | PASS |
| Boiling test | PASS | PASS | PASS |

In Table 1, the performance test methods are as follows:
(1) Adhesion Test

5×5 small grids with a size of 2 mm×2 mm were scribed on a surface of each test sample, and each scribed line should be as deep as a bottom layer of a coating; an adhesive tape with an adhesive force of (10±1) N/25 mm was used to firmly bond the tested small grids, and the tape was squeezed with nails (note that nails should not destroy the adhesive tape) to expel air bubbles between the adhesive tape and the coating, so as to increase a contact area and strength between the adhesive tape and a tested area. After the sample stood for (90±30) s, an end of the adhesive tape was grabbed by hand, to pull off the adhesive tape in a reverse direction of 60° C. within 0.5 s~1 s, and the test was performed once. After the test, a 5× magnifying glass was used to check a falling off status of the paint coating.

(2) Alcohol Friction

To-be-tested samples were covered with alcohol with a concentration greater than 99.5% for 15 minutes, and then stored at a laboratory temperature for 2 hours. Minimum quantity of samples: 3 pcs.

(3) Rubber Friction

Glass: An eraser No. 74/75215 was used, and a force of 500 g was applied, with a speed of 40 cycles/min, and a test stroke of 25 mm.

Mylar: A wear-resistant test eraser FABER-CASTELL7017R was used, and a force of 500 g was applied, with a speed of 40 cycles/minute, and a test stroke of 25 mm.

(4) Vibration Friction

An R180/530 TE-30 vibration friction tester was used, and a single housing/card tray was tested for 2 hours.

(5) Pencil Hardness

CG class: A 7H test pencil lead was used, and 5 strokes were scribed at a to-be-tested position with a pressure of 750 gf and an angle between the pencil lead and a to-be-tested surface being 45°, with each stroke 20 mm long.

Mylar coating class: Test method 1: A 2H test pencil lead was used, and five strokes were scribed at a to-be-tested position with a pressure of 750 gf and an angle between the pencil lead and a to-be-tested surface being 45°, with each stroke being 20 mm long; test method 2: An HB test pencil lead was used, and five strokes were scribed at a to-be-tested position with a pressure of 1000 gf and an angle between the pencil lead and a to-be-tested surface being 45°, with each stroke being 20 mm long.

(6) Cosmetic Resistance Test

Vaseline special-effect moisturizing lotion (dry-skin moisturizing formula) was applied on a surface of each to-be-tested sample, and two alternating damp heat cycles was performed (48 hours).

(7) Hand Sweat Resistance Test

The surface of each sample was wiped gently for 2 minutes with a dust-free cloth soaked in sweat, and the sample stood at a normal temperature for 2 hours.

(8) Low-Temperature Storage

Samples were kept for 24 hours at a temperature of −40° C. and an incubator temperature change rate of 1° C./minute.

(9) High-Temperature Storage

Samples were kept for 24 hours at a temperature of 70° C. and an incubator temperature change rate of 1° C./minute.

(10) Alternating Damp Heat

Samples were tested at a temperature of 25° C.~55° C. and a humidity of 95%±2% for a total of 72 h (3 cycles), with each cycle lasting for 24 hours; and the samples were kept at 25° C. and 75% RH for 2 hours.

(11) Temperature Shock

At −30° C./65° C., samples were kept for 1 hour at each temperature point, and the temperature was quickly switched within 3 minutes, with a total of 24 cycles for 48 hours. After an environmental test was completed, the coating surface needed to undergo an adhesion test.

(12) Solar Radiation

A test with one cycle lasting for 24 hours was performed. Specifically, samples were kept for 20 hours at dry heat of 40° C. and a solar radiation intensity of 1120 W/m$^2$, and then a solar radiation source was off for 4 hours, with one test cycle including 3 cycles.

(13) Boiling Test

Sample were boiled for 30 minutes with purified water at 80° C.±2° C. After being kept at normal temperature for 2 h, the samples underwent the adhesion test.

It can be learned from Table 1 that the finish coat composition according to this application has relatively high reliability.

Figure 8:
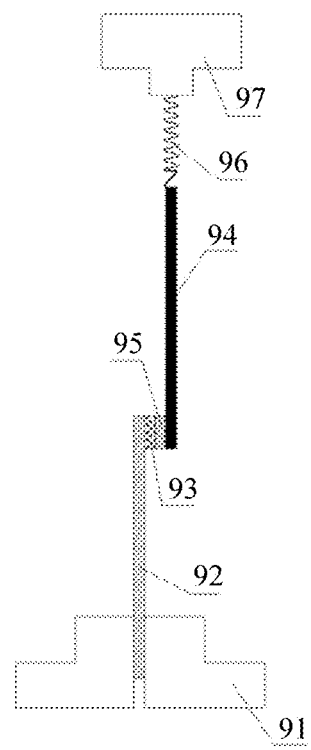
FIG. 8 shows a testing device according to an embodiment of this application.

Bonding strength testing was performed on the finish coat compositions in Embodiments 1 to 3, and a shear strength was tested based on a method provided in GB/T-7124-2008. The specific method is as follows:

A testing device is shown in FIG. 8. FIG. 8 shows a testing device according to an embodiment of this application. The testing device includes: a clamp 91 for fixing a first polycarbonate (PC) sheet 92, where an end of the first PC sheet 92 far from the clamp 91 is coated with a cured finish coat 93 in each of Embodiments 1 to 3; and a second PC sheet 94, where one end of the second PC sheet 94 is bonded to the finish coat 93 on the first PC sheet 2 by using a PUR adhesive 95, and the other end thereof is connected to a forcing device 97 by a flexible connecting device 96. The flexible connecting device 96 can ensure coaxiality of a force, and the forcing device 97 applies a tension to the second PC sheet 94.

Table 2 shows bonding strength test conditions and results of the finish coat compositions according to embodiments of this application.

TABLE 2

Bonding strength test conditions and results of the finish coat compositions according to embodiments of this application

| Solution | Serial number | Shear conditions and results | | | Average shear strength/ MPa |
|---|---|---|---|---|---|
| | | Shear force/N | Area/ μm$^2$ | Shear strength/ MPa | |
| Embodiment 1 | 1# | 168.50 | 9,111,219 | 18.49 | 19.73 |
| | 2# | 154.60 | 7,295,743 | 21.19 | |
| | 3# | 175.20 | 8,802,636 | 19.90 | |
| | 4# | 130.90 | 9,272,989 | 14.12 | |
| | 5# | 213.50 | 8,558,872 | 24.94 | |
| Embodiment 2 | 1# | 209.00 | 7,322,879 | 28.54 | 22.27 |
| | 2# | 179.40 | 6,914,576 | 25.95 | |
| | 3# | 180.80 | 6,420,955 | 28.16 | |
| | 4# | 94.00 | 9,332,268 | 10.07 | |
| | 5# | 190.50 | 10,213,141 | 18.65 | |
| Embodiment 3 | 1# | 139.55 | 8,843,079 | 15.78 | 20.59 |
| | 2# | 107.82 | 7,832,014 | 13.77 | |
| | 3# | 199.48 | 8,427,573 | 23.67 | |
| | 4# | 202.60 | 6,279,129 | 32.27 | |
| | 5# | 135.20 | 7,748,358 | 17.45 | |
| Comparative Example 1 | 1# | 100.00 | 7,111,249 | 14.06 | 13.13 |
| | 2# | 93.90 | 8,912,330 | 10.54 | |
| | 3# | 143.60 | 8,864,685 | 16.20 | |
| | 4# | 114.00 | 8,235,332 | 13.84 | |
| | 5# | 92.40 | 8,381,590 | 11.02 | |

Comparative example 1 is a Merlia finish coat purchased from the market.

It can be learned from Table 2 that a good bonding strength is achieved between the finish coat composition according to this application and a PUR adhesive.

The foregoing descriptions are merely specific implementations of this application, but are not intended to limit the protection scope of this application. Any variation or replacement made within the technical scope disclosed in this application shall fall within the protection scope of this application. Therefore, the protection scope of this application shall be subject to the protection scope of the claims.

What is claimed is:

1. A finish coat composition, comprising:
   30~60 parts by mass of a film-forming resin, wherein the film-forming resin comprises one or more of acrylic resins and polyurethane acrylate resins;
   5~20 parts by mass of an acrylate monomer;
   1~10 parts by mass of a photoinitiator;
   0.5~10 parts by mass of a leveling agent, the leveling agent comprising a polyacrylate leveling agent;
   a matting powder to provide a matte effect, the matting powder comprising an organic modified chemically-precipitated silica or fumed silica; and
   20~50 parts by mass of a solvent.

2. The finish coat composition according to claim 1, wherein the film-forming resin comprises one or more of tetrafunctional modified acrylic resins or hexafunctional aliphatic polyurethane acrylates.

3. The finish coat composition according to claim 1, wherein the acrylate monomer comprises one or more of tripropylene glycol diacrylate, 1,6-hexanediol diacrylate, trimethylolpropane triacrylate, hydroxypropyl acrylate, hydroxyethyl acrylate, and dodecyl acrylate.

4. The finish coat composition according to claim 1, wherein the leveling agent further comprises a silicone leveling agent.

5. The finish coat composition according to claim 1, wherein the solvent comprises any two or more of acetone, n-butanol, ethylene glycol-butadiene, and ethyl acetate.

6. The finish coat composition according to claim 5,
   wherein the film-forming resin is 40~55 parts by mass of the finish coat composition;
   wherein the acrylate monomer is 8~18 parts by mass of the finish coat composition;
   wherein the photoinitiator is 1.5~8 parts by mass of the finish coat composition;
   wherein the leveling agent is 0.8~8 parts by mass of the finish coat composition;
   wherein the matting powder is up to 20 parts by mass of the finish coat composition; and
   wherein the solvent is 25~40 parts by mass of the finish coat composition.

7. The finish coat composition according to claim 5,
   wherein the film-forming resin is 45~50 parts by mass of the finish coat composition;
   wherein the acrylate monomer is 10~15 parts by mass of the finish coat composition;
   wherein the photoinitiator is 2~4 parts by mass of the finish coat composition;
   wherein the leveling agent is 1~5 parts by mass of the finish coat composition;
   wherein the matting powder is 5~15 parts by mass of the finish coat composition; and
   wherein the solvent is 25~40 parts by mass of the finish coat composition.

8. The finish coat composition according to claim 7, wherein the film-forming resin is polyurethane acrylate;
   the acrylate monomer is tripropylene glycol diacrylate and dodecyl acrylate at a mass ratio of 1:2;
   the photoinitiator is a mixture of two photoinitiators at a mass ratio of 1:1;
   the leveling agent is a mixture of two leveling agents at a mass ratio of 5:1;
   the solvent is acetone and n-butanol at a volume ratio of 1:1; and
   the matting powder is fumed silica or precipitated silica.

9. The finish coat composition according to claim 1, wherein the matting powder comprises is 5~15 parts by mass of the finish coat composition.

10. A composite material, comprising:
    a plastic substrate layer; and
    a finish coat layer composited at the plastic substrate layer, wherein the finish coat layer is obtained by crosslinking and curing a finish coat composition;
    the finish coat composition comprises 30~60 parts by mass of a film-forming resin, 5~20 parts by mass of an acrylate monomer, 1~10 parts by mass of a photoinitiator, 0.5~10 parts by mass of a leveling agent, a matting powder to provide a matte effect, and 20~50 parts by mass of a solvent, wherein:
    the leveling agent comprises a polyacrylate leveling agent,
    the matting powder comprises an organic modified chemically-precipitated silica or fumed silica; and
    the film-forming resin comprises one or more of acrylic resins and polyurethane acrylate resins.

11. The composite material according to claim 10, wherein the plastic substrate layer is a polycarbonate layer, a nylon layer, a glass fiber-modified nylon layer, a glass fiber-modified polycarbonate layer, or an aramid fiber-modified polycarbonate layer.

12. The composite material according to claim 11, further comprising:
    a base coat layer composited between the plastic substrate layer and the finish coat layer.

13. The composite material according to claim 12, further comprising:
    an effect layer composited between the base coat layer and the finish coat layer.

14. The composite material according to claim 10, wherein a shear strength between the finish coat layer and the plastic substrate layer is 15 MPa or more.

15. The composite material according to claim 14, wherein the shear strength between the finish coat layer and the plastic substrate layer is 19 MPa or more.

16. A middle frame of an electronic device comprising:
    a composite material comprising:
       a plastic substrate layer,
       a finish coat layer composited at the plastic substrate layer, and
       an effect layer disposed between the plastic substrate layer and the finish coat layer, the effect layer providing a glare effect to the composite material,
    the finish coat layer being obtained by crosslinking and curing a finish coat composition;
    the finish coat composition comprising 30~60 parts by mass of a film-forming resin, 5~20 parts by mass of an acrylate monomer, 1~10 parts by mass of a photoinitiator, 0.5~10 parts by mass of a leveling agent, 0~20 parts by mass of a matting powder, and 20~50 parts by mass of a solvent, wherein:
    the leveling agent comprises a polyacrylate leveling agent,
    the matting powder comprises an organic modified chemically-precipitated silica or fumed silica; and
    the film-forming resin comprises one or more of acrylic resins and polyurethane acrylate resins.

17. The middle frame according to claim 16, further comprising a base coat layer composited between the plastic substrate layer and the optical effect layer.

18. The middle frame according to claim 16, wherein the plastic substrate layer is a polycarbonate layer, a nylon layer, a glass fiber-modified nylon layer, a glass fiber-modified polycarbonate layer, or an aramid fiber-modified polycarbonate layer.

19. The middle frame according to claim 16, wherein the acrylate monomer comprises one or more of tripropylene glycol diacrylate, 1,6-hexanediol diacrylate, trimethylolpropane triacrylate, hydroxypropyl acrylate, hydroxyethyl acrylate, and dodecyl acrylate.

20. The middle frame according to claim 16, wherein the leveling agent comprises a silicone leveling agent, wherein the solvent comprises any two or more of acetone, n-butanol, ethylene glycol-butadiene, and ethyl acetate.

* * * * *

UNITED STATES PATENT AND TRADEMARK OFFICE
CERTIFICATE OF CORRECTION

PATENT NO. : 12,492,319 B2
APPLICATION NO. : 18/033989
DATED : December 9, 2025
INVENTOR(S) : Wang et al.

Page 1 of 1

It is certified that error appears in the above-identified patent and that said Letters Patent is hereby corrected as shown below:

In the Claims

In Column 16, in Claim 9, Line 2, after "powder" delete "comprises".

In Column 16, in Claim 17, Line 65, after "and the" delete "optical".

Signed and Sealed this
Third Day of February, 2026

John A. Squires
*Director of the United States Patent and Trademark Office*